(12) United States Patent
Hey-Shipton

(10) Patent No.: US 10,230,350 B2
(45) Date of Patent: Mar. 12, 2019

(54) SURFACE ACOUSTIC WAVE FILTERS WITH EXTRACTED POLES

(71) Applicant: Resonant Inc., Santa Barbara, CA (US)

(72) Inventor: Gregory L. Hey-Shipton, Santa Barbara, CA (US)

(73) Assignee: Resonant Inc., Santa Barbara, CA (US)

( * ) Notice: Subject to any disclaimer, the term of this patent is extended or adjusted under 35 U.S.C. 154(b) by 0 days.

(21) Appl. No.: 15/399,427

(22) Filed: Jan. 5, 2017

(65) Prior Publication Data

US 2017/0366166 A1    Dec. 21, 2017

Related U.S. Application Data

(60) Provisional application No. 62/350,554, filed on Jun. 15, 2016.

(51) Int. Cl.
*H03H 9/64* (2006.01)
*H03H 9/72* (2006.01)

(52) U.S. Cl.
CPC ............ *H03H 9/64* (2013.01); *H03H 9/6483* (2013.01); *H03H 9/725* (2013.01)

(58) Field of Classification Search
CPC .......................................... H03H 9/46–9/6496
USPC .......................................... 333/133, 186–196
See application file for complete search history.

(56) References Cited

U.S. PATENT DOCUMENTS

| 4,360,793 A | 11/1982 | Rhodes et al. |
| 5,638,036 A | 6/1997 | Penunuri et al. |
| 5,854,579 A | 12/1998 | Penunuri |
| 5,926,079 A | 7/1999 | Heine et al. |
| 7,825,746 B2 | 11/2010 | Yeung et al. |
| 8,508,316 B2 | 8/2013 | Link |
| 8,701,065 B1 * | 4/2014 | Silver .................. H03H 9/465 333/133 |
| 8,751,993 B1 | 6/2014 | Fenzi et al. |
| 8,990,742 B2 | 3/2015 | Turner et al. |
| 9,038,005 B2 | 5/2015 | Turner et al. |
| 9,165,101 B2 | 10/2015 | Turner et al. |
| 9,208,274 B2 | 12/2015 | Turner et al. |
| 9,325,294 B2 | 4/2016 | Silver et al. |
| 9,331,669 B2 | 5/2016 | Costa et al. |
| 9,369,111 B1 | 6/2016 | McHugh et al. |

(Continued)

OTHER PUBLICATIONS

World Intellectual Property Organization, International Search Report and Written Opinion for International Application No. PCT/US2017/037532, dated Sep. 6, 2017, 9 total pages.

(Continued)

*Primary Examiner* — Dean O Takaoka
*Assistant Examiner* — Alan Wong
(74) *Attorney, Agent, or Firm* — SoCal IP Law Group LLP; John E. Gunther; Steven C. Sereboff

(57) ABSTRACT

Bandpass filters and methods of designing bandpass filters are disclosed. A bandpass filter includes a plurality of series acoustic resonators connected in series between an input and an output, and a plurality of\ shunt acoustic resonators, each shunt acoustic resonator connected between a ground and one of the input, the output, and a junction between two of the plurality of series acoustic resonators. A first shunt resonator of the plurality of shunt resonators has a motional resonance frequency higher than and adjacent to an upper edge of a passband of the bandpass filter.

11 Claims, 11 Drawing Sheets

(56) References Cited

U.S. PATENT DOCUMENTS

| | | |
|---|---|---|
| 9,374,061 B1 | 6/2016 | Costa et al. |
| 9,391,351 B2 | 7/2016 | Raihn et al. |
| 9,524,360 B2 | 12/2016 | Turner et al. |
| 9,525,393 B1 | 12/2016 | Raihn et al. |
| 9,608,595 B1 | 3/2017 | Raihn et al. |
| 9,654,078 B1 | 5/2017 | Raihn et al. |
| 2014/0218129 A1* | 8/2014 | Fujiwara .............. H03H 9/6483 333/133 |
| 2015/0214923 A1 | 7/2015 | Tsuzuki |
| 2017/0083649 A1 | 3/2017 | Yang et al. |

OTHER PUBLICATIONS

Mahbubeh Esmaeili et al., "Substrate integrated waveguide bandstop filter using partial-height via-hole resonators in thick substrate" IET Journals, IET Microw. Antennas Propag., 2015, vol. 9, Iss. 12, pp. 1307-1312.

J. D. Rhodes and R. J. Cameron, "General extracted pole synthesis technique with applications to low-loss TE011 mode filters," IEEE Trans. Microwave Theory Tech, vol. MTT-28, pp. 1018-1028, 1980.

\* cited by examiner

SURFACE ACOUSTIC WAVE FILTERS WITH EXTRACTED POLES

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from provisional patent application 62/350,554, filed Jun. 15, 2016, titled SURFACE ACOUSTIC WAVE FILTERS WITH EXTRACTED POLES.

BACKGROUND

Field

This disclosure relates to radio frequency filters using surface acoustic wave (SAW) resonators, and specifically to filters and duplexers for use in communications equipment.

Description of the Related Art

As shown in FIG. 1, a SAW resonator 100 may be formed by thin film conductor patterns formed on a surface of a substrate 105 made of a piezoelectric material such as quartz, lithium niobate, lithium tantalate, or lanthanum gallium silicate. The substrate 105 may be a single-crystal slab of the piezoelectric material, or may be a composite substrate including a thin single-crystal wafer of the piezoelectric material bonded to another material such as silicon, sapphire, or quartz. A composite substrate may be used to provide a thermal expansion coefficient different from the thermal expansion coefficient of the single-crystal piezoelectric material alone. A first inter-digital transducer (IDT) 110 may include a plurality of parallel conductors. A radio frequency or microwave signal applied to the first IDT 110 via an input terminal IN may generate an acoustic wave on the surface of the substrate 105. As shown in FIG. 1, the surface acoustic wave will propagate in the left-right direction. A second IDT 120 may convert the acoustic wave back into a radio frequency or microwave signal at an output terminal OUT. The conductors of the second IDT 120 may be interleaved with the conductors of the first IDT 110 as shown. In other SAW resonator configurations (not shown), the conductors forming the second IDT may be disposed on the surface of the substrate 105 adjacent to, or separated from, the conductors forming the first IDT. Also, extra fingers (commonly called "dummy" fingers) may be formed opposite to the ends of the IDT fingers and connected to the IN and OUT terminals bars of 110 and 120. Grating reflectors 130, 135 may be disposed on the substrate to confine most of the energy of the acoustic waves to the area of the substrate occupied by the first and second IDTs 110, 120. The grating reflectors 130, 135 may be floating or connected to either the IN terminal bar 110 or the OUT terminal bar 120. In general, the SAW resonator 100 is bi-directional, and the IN and OUT terminal designations may be transposed.

The electro-acoustic coupling between the first IDT 110 and the second IDT 120 is highly frequency-dependent. The basic behavior of acoustic resonators (SAW, bulk acoustic wave, film bulk acoustic wave, etc.) is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design bandpass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \qquad (1)$$

The frequency $F_a$ of the anti-resonance is given by $$F_a = F_r \sqrt{1 + \frac{1}{\gamma}} \qquad (2)$$

where $\gamma = C_0/C_m$ is a characteristic of the substrate upon which the SAW resonator is fabricated. $\gamma$ is dependent on both the material and the orientation of the crystalline axes of the substrate, as well as the physical design of the IDTs.

The frequencies of the motional resonance and the anti-resonance are determined primarily by the pitch and orientation of the interdigitated conductors, the choice of substrate material, and the crystallographic orientation of the substrate material.

FIG. 2B is a plot of the admittance of a theoretical lossless acoustic resonator. The admittance exhibits a motional resonance 212 where the admittance of the resonator approaches infinity, and an anti-resonance 214 where the admittance of the resonator approaches zero. In over-simplified terms, the lossless acoustic resonator can be considered a short circuit at the frequency of the motional resonance 212 and an open circuit at the frequency of the anti-resonance 214. The frequencies of the motional resonance 212 and the anti-resonance 214 are representative, and a resonator may be designed for other frequencies.

SAW resonators are used in a variety of radio frequency filters including band reject filters, bandpass filters, duplexers, and multiplexers. A duplexer is a radio frequency filter device that allows simultaneous transmission in a first frequency band and reception in a second frequency band (different from the first frequency band) using a common antenna. A multiplexer is a radio frequency filter with more than 2 input or output ports with multiple passbands. Duplexers, which are 3-port multiplexers with 2 passbands, and multiplexers are commonly found in radio communications equipment including cellular telephones.

Throughout this description, elements appearing in figures are assigned three-digit reference designators, where the most significant digit is the figure number where the element is first shown and the two least significant digits are specific to the element. An element that is not described in conjunction with a figure may be presumed to have the same characteristics and function as a previously-described element having the same reference designator.

DETAILED DESCRIPTION

Description of Apparatus

Figure 3:
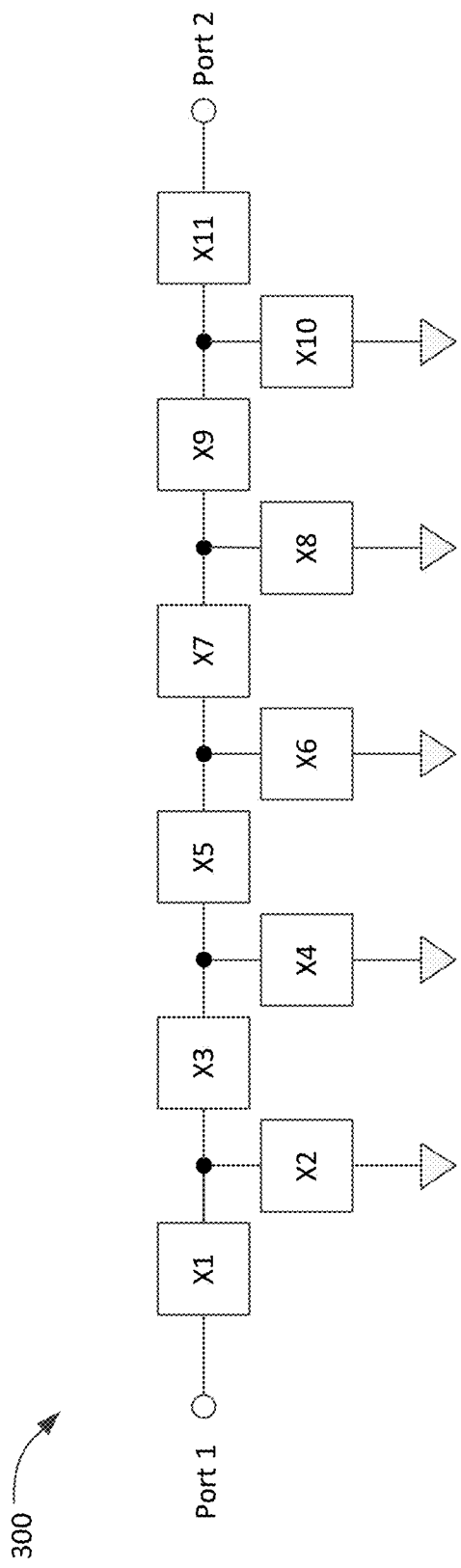
FIG. 3 is a schematic diagram of an exemplary SAW filter circuit.

Radio frequency filter circuits commonly incorporate more than one SAW resonator. For example, FIG. 3 shows a schematic diagram of an exemplary bandpass filter circuit 300 incorporating eleven SAW resonators, labeled X1 through X11, arranged in what is commonly called a "ladder" configuration. The filter circuit 300 may be, for example, a transmit filter or a receive filter for incorporation into a communications device. The filter circuit 300 includes six series resonators (X1, X3, X5, X7, X9, and X11) connected in series between an input (Port 1) and an output (Port 2). The filter circuit 300 includes five shunt resonators (X2, X4, X6, X8, and X10) connected between junctions of adjacent series resonators and ground. The use of eleven SAW resonators, six series resonators, and five shunt resonators is exemplary. A filter circuit may include more or fewer than eleven SAW resonators and a different arrangement of series and shunt resonators. Although not shown in FIG. 3 or any of the other schematic diagrams in this patent, filter circuits may also include reactive components such as inductors and capacitors.

Figure 1:
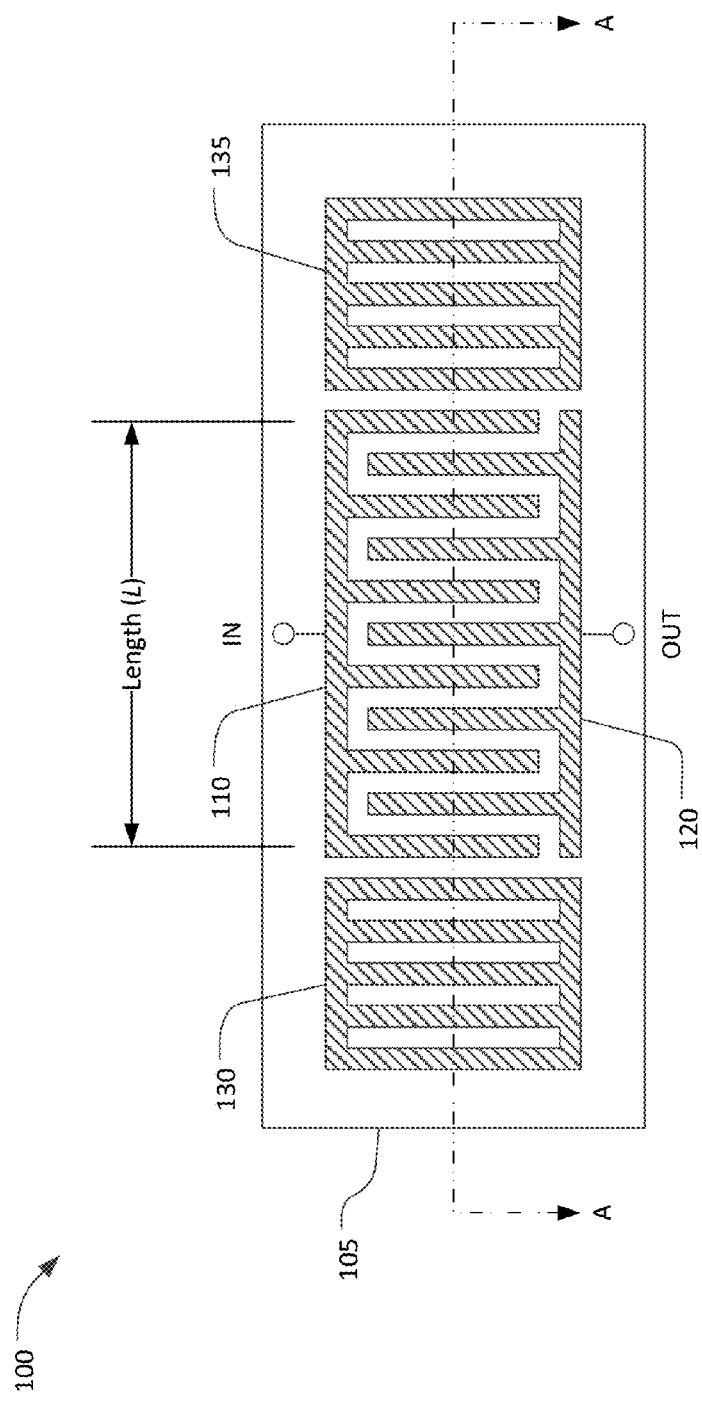
FIG. 1 is a simplified schematic plan view of a SAW resonator.

Each of the eleven resonators X1-X11 may be comprised of inter-digital transducers and grating reflectors as shown in FIG. 1. Each of the eleven resonators X1-X11 may have a corresponding motional resonant frequency, f1-f11. The motional resonant frequencies f1-f11 may all be different. The motional resonant frequencies of some of the resonators X1-X11 may be the same. Typically, the motional resonant frequencies f2, f4, f6, f8, f10 of the shunt resonators are offset from the motional resonant frequencies f1, f3, f5, f7, f9, f11 of the series resonators.

Assuming the resonators X1-X11 are lossless, each shunt resonator X2, X4, X6, X8, and X10 acts as a short circuit at its respective resonant frequency, and each series resonator acts as an open circuit at its respective anti-resonant frequency. Considering the filter circuit 300 as a whole, it can be understood that the attenuation of the filter from input to output is infinite (under the assumption that the resonators are lossless) at the motional resonant frequencies of the shunt resonators and the anti-resonant frequencies of the series resonators. These frequencies are commonly called attenuation poles or, equivalently, transmission zeros. The passband of the filter circuit 300 is a frequency range between the high and low side transmission zeros. In a typical ladder bandpass filter design, the motional resonant frequencies of series resonators fall within a passband frequency range, the anti-resonant frequencies of series resonators create transmission zeros above the passband frequency range. The opposite is true for shunt resonators. The anti-resonant frequencies of shunt resonators are within the passband frequency range, and the motional resonant frequencies of shunt resonators create transmission zeros below the passband frequency range.

The extent of a passband is subject to various definitions. For example, the extent of passband may be defined as the frequency band where the filter insertion loss is less than 1 dB or 3 dB, or the frequency band where the return loss at the input to the filter is at least 10 dB. Other definitions may be used. Regardless of the definition of the passband, the transitions between the passbands and the adjacent frequency bands (which have substantially higher insertion loss) are commonly called the upper and lower edges of the passband. An edge of a passband is commonly referred to as "sharp" if the transition from low loss to high rejection over a small frequency span.

Appropriate adjustment of the parameters of the acoustic devices, as known by those skilled in the art, can create band-pass filters with low loss passbands, high rejection in one or more stop bands, and very sharp edges. It is often required that higher rejection is required on one side of the passband of a bandpass filter than on the other side. For example, a transmit band and a receive band of a duplexer may have very little frequency separation, requiring transmit and receive bandpass filters with very high selectivity at the edges of the respective passbands closest in frequency to one another.

Simply adding more series-shunt sections to the ladder filter circuit 300 of FIG. 3 will improve selectivity on both sides of the passband, but at the expense of a larger and more costly circuit with higher passband insertion loss due to the extra devices. In some cases, it can be advantageous to repurpose one or more of the existing resonator devices by adjusting the respective resonant frequencies to move one or more transmission zeros from one side of the passband to the other. Moving a transmission zero associated with a resonator to the opposite side of the passband is equivalent to extracting an attenuation pole from one side and re-locating it to the other side of the passband (hence the name, "Extracted Pole").

Extracted poles have been employed in waveguide filters, for example as described in U.S. Pat. No. 4,360,793, where an extra resonant cavity is coupled to either the input or output port of a waveguide filter through a phase shifting section of transmission line. This requires an extra resonant cavity for each transmission zero that is coupled to the input and/or the output of the filter, and allows for the resulting transmission zero to be effectively tuned independently of the filter. These transmission zeros are extracted during filter synthesis, and instead of using non-adjacent cross coupled resonant cavities to create the transmission zeros, additional resonant cavities are added to the ends of the filter. Non-adjacent cross coupled resonant cavities are couplings (usually by a length of phase shifting transmission line) that are not couplings between adjacent resonators that form the main transmission path through the filter. These non-adjacent resonator coupling can produce real frequency low side transmission zeros, real frequency high side transmission zeros, a pair of real frequency transmission zeros (one high side and the other low side), and complex frequency zeros. Extracted poles are used in waveguide filters, and in the SAW filters described in this specification, to create single real frequency transmission zeros on either the high or low side of the passband.

The use of the term "extracted poles" in this specification is different from the use of this term in waveguide filters, in that acoustic resonators have both a motional resonance and an anti-resonance that produce an attenuation pole and zero simultaneously. As described subsequently, the transmission zero associated with an extracted pole acoustic resonator (i.e. the motional resonance for a shunt resonator and the anti-resonance for the series resonance) is moved from one side of the filter passband to the other side of the filter passband. The transmission pole generated by the extracted pole resonator (i.e. the anti-resonance for a shunt resonator and the motional resonance for a series resonator) is removed (or extracted) from the filter network and the frequency of this pole is no longer within the passband frequency range. This characteristic is not a part of the prior art, which is limited to single mode waveguide filter technology. The transmission zero created by a single mode waveguide resonator does not have an associated pole having a frequency within the passband of the filter and coupled with the other resonators to produce the passband response.

Commonly, one objective during SAW filter design is to minimize the cost of the filter, which leads to a desire to minimize the size of the piezoelectric substrate and the number of SAW resonators. If additional substrate areas is available, addition transmission zeros can be added to a filter by increasing the order of the filter, which is to say by adding additional resonators, which would add additional passband pole as well. Alternatively, an additional SAW resonator could be added to a ladder filter, with placement of the transmission zero such as to enhance the rejection characteristics, especially when the rejection requirements are asymmetrical about the passband. The other resonators of the ladder filter could be modified to account for the reactance of this additional resonator. Usually, there is not enough substrate space for adding a resonator, and re-tasking an existing resonator to create a transmission zero to enhance the rejection characteristics would be preferred. This would remove a pole from the passband, and the remaining resonators modified to account for this extracted resonance. This re-tasking, or extracting, of the resonator does not change the total number of resonators, and conceptually not require a larger substrate. Also, this resonator does not have to be located at the input or output terminals, and can be any of the resonators in the ladder network. However, experience has shown that the physical realizability of the resonator is improved by location at the ends of the filter.

It is possible to move the transmission zero to a different frequency, but remain on either the low or high side of the passband. If the associated pole remains within the passband frequency, then this is just a modification of the original filter, but with modified rejection characteristics. If the transmission zero were moved so that the associated pole was outside of the passband frequency range, then in addition to the transmission zero, the rejection characteristics could be adversely affected, commonly seen as a spike in the insertion loss. This could also be viewed as simply adding a resonator to the original filter network, rather than re-tasking an existing resonator.

The incorporation of extracted poles enhances the rejection characteristics of acoustic bandpass filters and multiplexers by appropriate placement of resonances of the acoustic resonators. In this patent, an "extracted" pole is a transmission pole at a frequency outside of the passband of a filter. Such an extracted pole is created by a resonator where neither the motional resonance frequency nor the anti-resonance frequency (as measured with the resonator in isolation from the network) are located within the passband frequency range of a filter circuit formed by a plurality of acoustic resonators. These extracted pole resonators may be created by repurposing resonators original used in the filter design, or may be added to a filter design to improve rejection characteristics.

In the case where an extracted pole is added to a design by repurposing an existing resonator, the effect is to move a transmission zero from one side of the passband (i.e. either above or below the passband) to the other side of the passband and to move the associate transmission pole from a frequency within the passband to a frequency outside of the passband. By moving a transmission zero from one side of the pass band to the other, the selectivity of the filter (i.e. the rate of rejection) can be preferentially improved on one side of the passband at the expense of the selectivity on the other side of the passband. Filter insertion loss and temperature stability can also be improved by this technique. More than one extracted pole can be incorporated into a filter design.

Extracted poles may be incorporated into a filter to optimize rejection characteristics to simultaneously achieve asymmetrical rejection characteristics and low passband insertion loss. The quality factor, Q, for acoustic resonator devices is usually higher for the motional resonance at frequency $F_r$ than for the anti-resonance at frequency $F_a$. The motional resonance of an extracted shunt resonator can be used to create a high side transmission zero (i.e. a transmission zero on the high frequency side of the passband) with lower high side passband edge loss than using the anti-resonance of a series resonator to produce transmission zero at the same frequency. Additionally, an extracted high side shunt resonator does not have a resonance within the passband, which may result in lower passband insertion loss. Transmission zeros due to anti-resonances of series resonators, which tend to cause higher loss when close to the passband edge, can be moved higher in frequency, away from the passband, which may also reduce passband insertion loss.

Another benefit of the used of extract poles accrues from the fact that the variation of resonant frequency with temperature is commonly lower for the motional resonance of an acoustic resonator than for the anti-resonance. Thus a passband edge defined by the motional resonance of a shunt resonator may have greater temperature stability than a passband edge defined by the anti-resonance of a series resonator.

Example 1

Figure 4:
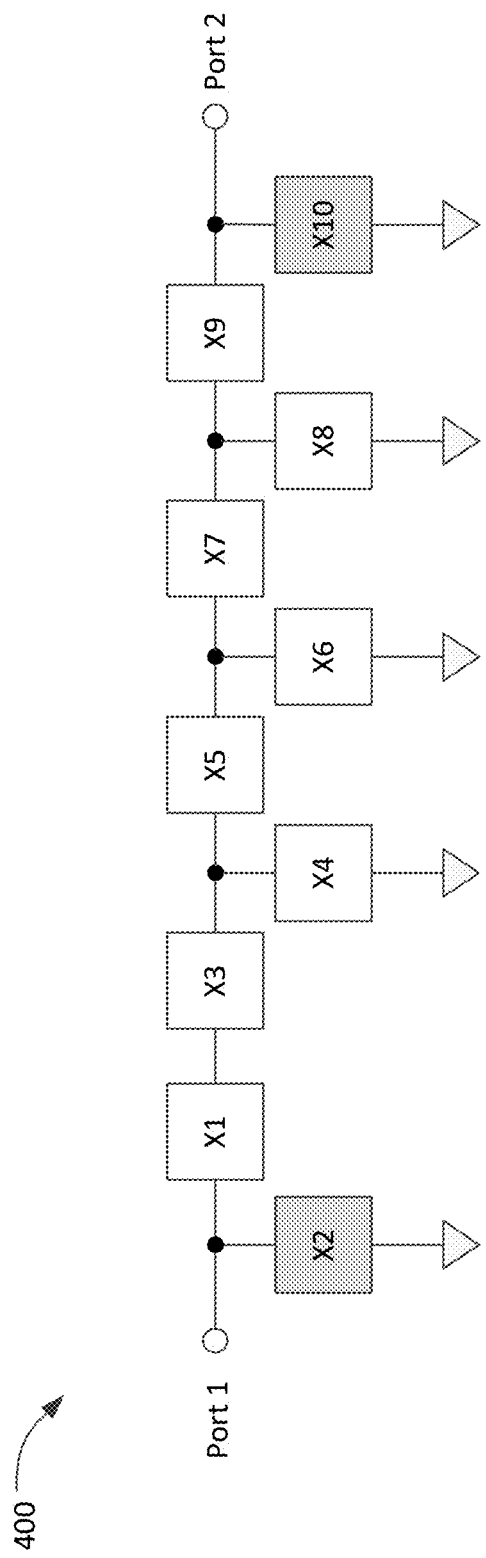
FIG. 4 is a schematic diagram of an exemplary SAW filter circuit including two extracted poles.

FIG. 4 is a schematic diagram of a bandpass filter 400 incorporating two extracted poles. The bandpass filter 400 is designed for use in UMTS (Universal Mobile Telecommunication System) Band 40 having a passband frequency range of 2300-2400 MHz. Band 40 is a Time Division Duplexed (TDD) band where the transmit and receive signals use the same frequency range but are separated in time. Band 40 has a severe rejection requirement on the high side of the passband due to Wi-Fi® signals that may be present in the frequency range 2401-2495 MHz, as specified in IEEE (Institute of Electrical and Electronic Engineers) Standard 802.11b/g/n. As it is not practical to create the desired rejection at the low frequency edge of the Wi-Fi frequency range, a compromise in the design is to require the bandpass filter 400 to provide significant rejection by the upper frequency end of Wi-Fi Channel 1 at 2423 MHz.

As shown in FIG. 4, the bandpass filter 400 is comprised of ten resonators designated X1 to X10. In this particular example, the arrangement of the ten resonators X1-X10 is slightly different from a typical ladder network (for example, as previously shown in FIG. 3) in that there are 2 resonators connected in series (X1 and X3). Resonators X1, X3, X5, X7, and X9 are series resonators. The anti-resonance of each of the series resonators X1, X3, X5, X7, X9 creates a transmission zero at a respective frequency higher than the passband of the bandpass filter 400. Resonators X4, X6, and X8 are shunt resonators. The motional resonance of each of the shunt resonators X4, X6, X8 creates a transmission zero at a respective frequency lower than the passband of the bandpass filter 400. Resonators X2 and X10 are extracted pole shunt resonators. The motional resonance of each of X2 and X10 creates a transmission zero at a respective frequency higher the passband of the bandpass filter 400. Both the motional resonance frequencies and the anti-resonance frequencies of X2 and X10 are higher than the passband of the bandpass filter 400. Extracted pole shunt resonators X2 and X10 are connected at the input and output ends, respectively, of the bandpass filter 400. The relocation of X2 from the junction of X1 and X3 is done in order to improve the physical realizability of resonator X2. In general, any of the shunt resonators could have been extracted, or added, at any of the nodes between series resonators.

Figure 5:
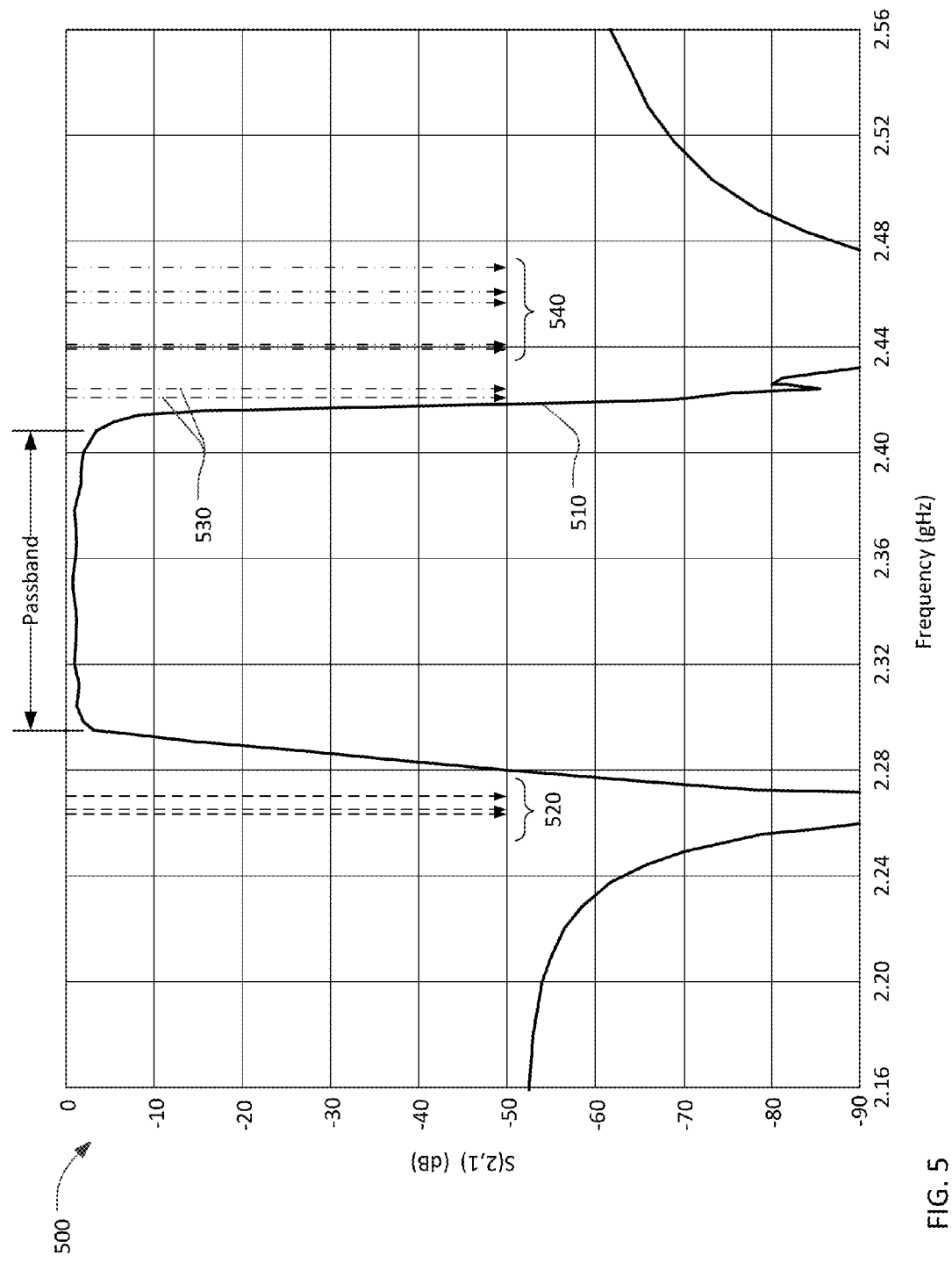
FIG. 5 is a graph of the S(1,2) parameter of the filter circuit of FIG. 4.

FIG. 5 is a graph 500 of the S(2,1) parameter of the bandpass filter 400 determined by simulation using BVD models for each of the resonators. S-parameters are a convention used to describe the performance of linear electrical networks. The solid line 510 is a plot of S(2,1), which is the voltage transfer function from port 1 to port 2 of an electrical network. S(2,1) is often expressed in dB, which is $20 \log_{10}[S(2,1)]$, and is essentially the power gain of the device. However, passive devices like SAW filters are usually characterized by the "insertion loss" of the filter, which is numerically the same as the power gain, but with a change in numeric sign (e.g. S(2,1)=−3 dB is equivalent to an insertion loss of 3 dB). In this case, the solid line 510 plots the input-to-output transfer function of the filter 300. For convenience, these S-parameters are assumed to be expressed in dB. In this example, the passband is 2.30 to 2.41 GHz when defined as the frequency band where S(2,1) is greater than −3 dB (less than 3 dB insertion loss).

Also shown in the graph 500 are the frequency locations of transmission zeros created by either the motional resonance of shunt connected devices, or the anti-resonance of series connected devices. The transmission zero frequency locations as indicated by dashed and broken arrows extending downward from the top of the graph 500. These arrows are shown for convenience in understanding the shape of the insertion loss response, and are not part of the measured or simulated response of the bandpass filter 400. Three dashed arrows 520 represent transmission zeros caused by the motional resonances of shunt resonators X4, X6, and X8. Five broken (dash-dot-dot) arrows 540 represent transmission zeros caused by the anti-resonances of series resonators X1, X3, X5, X7, and X9.

Two broken (dash-dot) arrows 530 represent transmission zeros caused by the motional resonances of extracted pole shunt resonators X2 and X10. By setting the motional resonant frequencies of the two extracted pole shunt resonators, X2 and X10, to frequencies (i.e. 2420 MHz and 2423 MHz) just above the upper edge of the passband of Band 40, two high-Q transmission zeros create a very sharp upper passband edge. The transmission zero at 2420 MHz may be described as "adjacent to" the upper edge of the passband since it is closer to the upper edge than any other transmission zero. In this example, the motional resonant frequencies of the two extracted pole shunt resonators, X2 and X10, are lower than the anti-resonant frequencies of all of the series resonators X1, X3, X5, X7, and X9.

Transmission zeros created by shunt resonators typically have higher Q than transmission zeros created by series resonators. Due to the generally higher Q of the resonance of the extracted-pole shunt resonators X2 and X10 that create the transmission zeros 530 just above the upper edge of the passband, these resonators degrade the insertion loss at the upper portion of the passband less than transmission zeros created by the anti-resonance of series resonators at similar frequencies. Additionally, since transmission zeros 530 just above the upper edge of the passband are created by extracted-pole shunt resonators X2 and X10, the transmission zeros 540 due to the anti-resonance of series resonators X1, X3, X5, X7, X10 are located at higher frequencies, away from the passband, which also reduces insertion loss in the higher frequency portion of the passband.

Example 2

Figure 6:
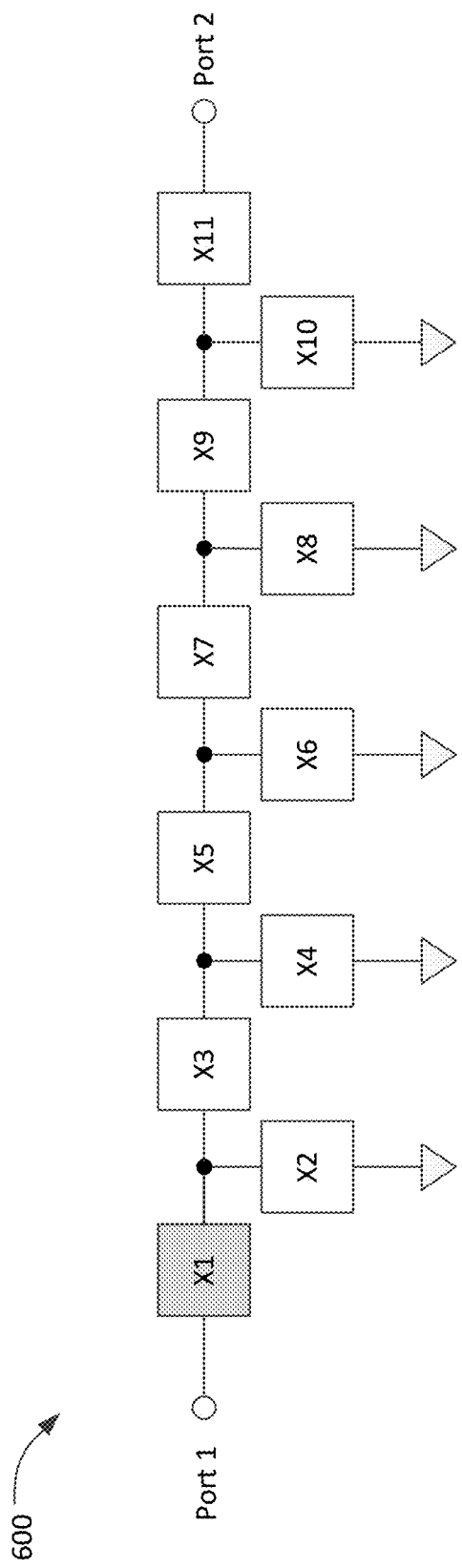
FIG. 6 is a schematic diagram of an exemplary SAW filter circuit including one extracted pole.

FIG. 6 is a schematic diagram of a bandpass filter 600 that includes an extracted pole series resonator to improve rejection on the low-frequency side of the passband. The bandpass filter 600 is designed for use in UMTS Band 41 having a passband frequency range of 2496-2690 MHz. Band 41 is also a Time Division Duplexed (TDD) band where transmit and receive signals use the same frequency range but are separated in time. A typical design objective for a Band 41 filter is to have greater than 40 dB rejection over the Wi-Fi frequency channels 1 through 13 (2401-2483 MHz), which is on the low side of the filter's passband.

As shown in FIG. 6, the bandpass filter 600 is comprised of eleven resonators designated X1 to X11. The arrangement of the eleven resonators X1-X11 is a conventional ladder network. Resonators X3, X5, X7, X9, and X11 are conventional series resonators. The anti-resonance of each of the five series resonators X3, X5, X7, X9, X11 creates a transmission zero at a respective frequency higher than the passband of the bandpass filter 600. Resonators X2, X4, X6, X8, and X10 are shunt resonators. The motional resonance of each of the shunt resonators X2, X4, X6, X8, X10 creates a transmission zero at a respective frequency lower than the passband of the bandpass filter 600. Resonator X1 is an extracted pole series resonator. The anti-resonance of X1 creates an additional transmission zero at a frequency lower than passband of the bandpass filter 600. Both the motional resonance frequency and the anti-resonance frequency of X1 are lower than the passband of the bandpass filter 600. Extracted pole series resonator X1 is connected at the input end, of the bandpass filter 600. In other filter designs, extracted pole series resonators may be connected at one or both of the input end and output end of the filter. Extracted poles created from series resonators that are not located at the ends of the filter as possible, but tend to be harder to physically realize than if they were at the ends of the filter.

Figure 7:
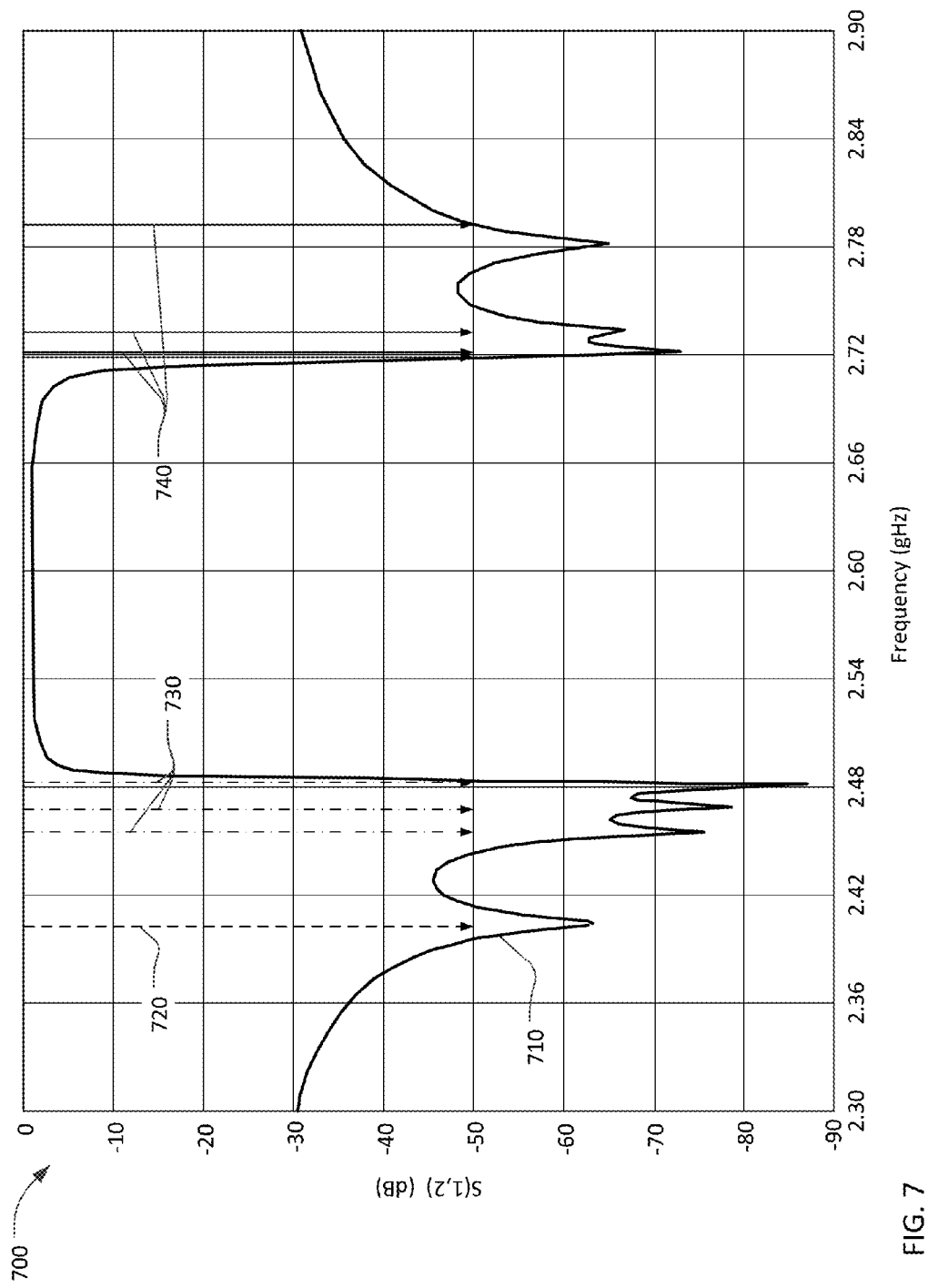
FIG. 7 is a graph of the S(1,2) parameter of the filter circuit of FIG. 6.

FIG. 7 is a graph 700 of the S(1,2) parameter of the bandpass filter 600 determined by simulation using BVD models for each of the resonators. The solid line 710 plots the input-to-output transfer function in dB of the bandpass filter 600. Also shown in the graph 700 are the frequency locations of transmission zeros created by either the motional resonance of shunt connected devices, or the anti-resonance of series connected devices. The transmission zero frequency locations as indicated by dashed, broken, and solid arrows 720, 730, 740 extending downward from the top of the graph 500. These arrows are shown for convenience in understanding the shape of the insertion loss response, and are not part of the measured or simulated response of the bandpass filter 400.

The dashed arrow 720 represents a transmission zero caused by anti-resonances of extracted pole series resonator X1. The frequency of this transmission zero was selected to extend the lower edge of the rejection band below the filter's passband. Without this placement of the transmission zero, rejection of the Wi-Fi frequencies near 2400 MHz would be problematic. The extracted pole series resonator transmission zero is the lowest frequency transmission zero so that the lower Q anti-resonance transmission zero has less effect on the filter's insertion loss at the low side of the passband than if it were at a frequency closer to the low edge of the passband.

The broken (dash-dot) arrows 730 represent transmission zeros caused by the motional resonances of shunt resonators X2, X4, X6, X8 and X10. Several of these high-Q transmission zeros are located at frequencies immediately adjacent to the lower side of the passband to provide a very sharp transition between the passband and the lower side rejection and. The solid arrows 740 represent transmission zeros caused by the anti-resonances of series resonators X3, X5, X7, X9, and X11.

Example 3

The incorporation of one or more extracted pole resonators can also improve the performance of duplexers for uses in communications systems. A duplexer is a radio frequency filter device that allows simultaneous transmission in a transmit frequency band and reception in a receive frequency band (different from the transmit frequency band) using a common antenna. A duplexer normally consists of a transmit bandpass filter that passes the transmit frequency band signals and rejects the receive frequency band signals, and a receive bandpass filter the passes the receive frequency band signals and rejects the transmit frequency band signals. For some frequency bands, the spacing between the transmit frequency band and the receive frequency band is very small, necessitating extreme sharp rejection characteristics at the edges of the passbands of the transmit and receive bandpass filters. UMTS Band 25 is a good example a duplexer with difficult rejection requirements. Band 25 only provides 15 MHz between the upper end of the transmit band (1850-1915 MHz) and the lower end of the receive band (1930-1995 MHz). This very narrow range of frequencies between the bands makes it difficult to achieve high cross band rejection while simultaneously achieving low band edge insertion loss, particularly on the high end of the transmit passband.

Figure 8:
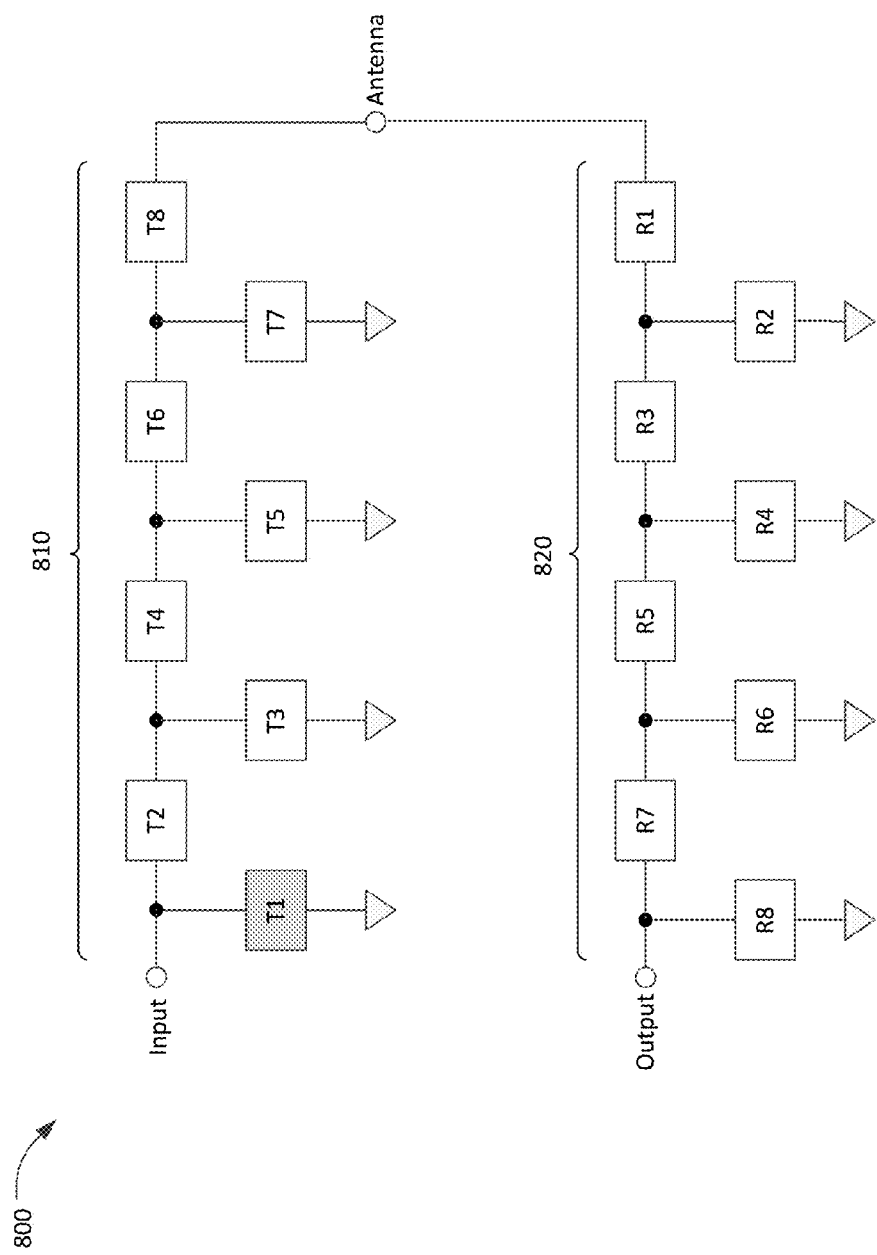
FIG. 8 is a schematic diagram of an exemplary SAW duplexer circuit including one extracted pole.

FIG. 8 is a schematic diagram of a Band 25 duplexer 800 consisting of a transmit bandpass filter 810 and a receive bandpass filter 820. The transmit bandpass filter 810 includes eight resonators identified as T1 through T8. Resonator T1 is an extract pole shunt resonator that creates a transmission zero adjacent to the high end of the transmit frequency band. Resonators T3, T5, and T7 are shunt resonators that create transmission zeros at frequencies below the transmit frequency band. Resonators T2, T4, T6, and T8 are series resonators that create transmission zeros at frequencies above the transmit frequency band.

The receive bandpass filter 820 includes eight resonators identified as R1 through R8. Resonators R2, R4, R6, and R8 are shunt resonators that create transmission zeros at frequencies below the receive frequency band. Resonators R1, R3, R5, and R7 are series resonators that create transmission zeros at frequencies above the receive frequency band. While this example uses eight resonators in both the transmit and receive bandpass filters, the number of resonators in either bandpass filter may be more or fewer than eight, depending on the technical requirements of the duplexer. Although not shown in this example, one or more of the transmit bandpass filter, the receive bandpass filter, and the common antenna port may incorporate one or more reactive components such as inductors and/or capacitors.

Figure 9:
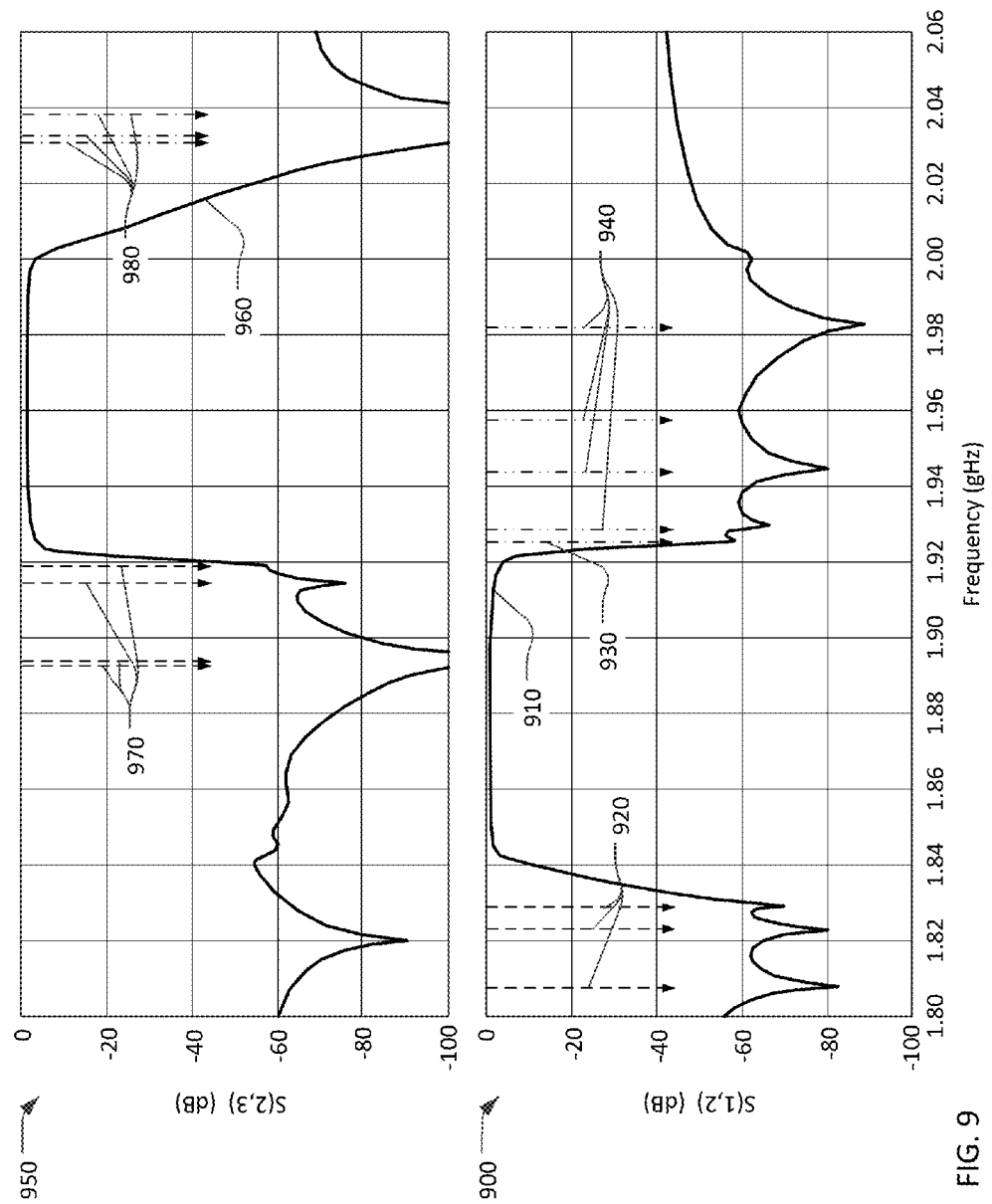
FIG. 9 is a graph of the S(1,2) and S(2,3) parameters of the duplexer circuit of FIG. 8.

FIG. 9 includes a graph 900 of the S(1,2) parameter in dB of the duplexer 800, which is the transfer function from the transmit input port to the antenna port shown in FIG. 8. The solid line 910 is a plot of the input-to-output transfer function of the transmit bandpass filter 810 determined by simulation using BVD models for each of the resonators. Also shown in the graph 900 are the frequency locations of transmission zeros created by either the motional resonance of shunt connected devices, or the anti-resonance of series connected devices. The transmission zero frequency locations as indicated by dashed and broken arrows 920, 930, 940 extending downward from the top of the graph 500. These arrows are shown for convenience in understanding the shape of the insertion loss response, and are not part of the measured or simulated response of the transmit bandpass filter 810.

The dashed arrows 920 represent transmission zeros caused by the motional resonances of shut resonators T3, T5, and T7, which are located at frequencies below the passband of the transmit bandpass filter. The broken (dash-dot) arrow 930 represents a transmission zero caused by the motional resonance of extract pole shunt resonator T1. Positioning this high-Q transmission zeros at a frequency above and immediately adjacent to the upper side of the pass-band provide a very sharp transition between the passband and the upper side rejection band. The broken (dash-dot-dot) arrows 940 represent transmission zeros caused by the anti-resonances of series resonators T2, T4, T6, and T8. The motional resonance frequency of extract pole shunt resonator T1 is less than the anti-resonance frequencies of series resonators T2, T4, T6, and T8.

FIG. 9 also includes a graph 950 of the S(2,3) in dB parameter of the duplexer 800, which is the transfer function from the antenna port to the output port shown in FIG. 8. The solid line 960 is a plot of the input-to-output transfer function of the receive bandpass filter 820 determined by simulation using BVD models for each of the resonators. Also shown in the graph 950 are the frequency locations of transmission zeros created by either the motional resonance of shunt connected devices, or the anti-resonance of series connected devices. The transmission zero frequency locations as indicated by dashed and broken arrows 970 and 980 extending downward from the top of the graph 950. These arrows are shown for convenience in understanding the shape of the insertion loss response, and are not part of the measured or simulated response of the receive bandpass filter 820.

The dashed arrows 970 represent transmission zeros caused by the motional resonances of shunt resonators R2, R4, R6, and R8, which are located at frequencies below the passband of the receive bandpass filter. Positioning one of these high-Q transmission zeros at a frequency immediately adjacent to the lower side of the pass-band provide a very sharp transition between the passband and the lower side rejection band. The broken (dash-dot) arrows 980 represent transmission zeros caused by the anti-resonances of series resonators R1, R3, R5, and R7.

The techniques above for single passband filters, and double passband duplexers, can also be applied to other types of filter such as multiplexers and multi-passband filters. In general, the strategic use of these extracted resonances (where both the $F_r$ and the $F_a$ frequencies of the acoustic devices, when measured is isolation of the network, are outside of the passband) can enhance the performance of the acoustic filters in several areas. This can result in optimal use of acoustic devices to achieve the required performance typical in modern mobile telecommunication equipment.

Description of Processes

Figure 10:
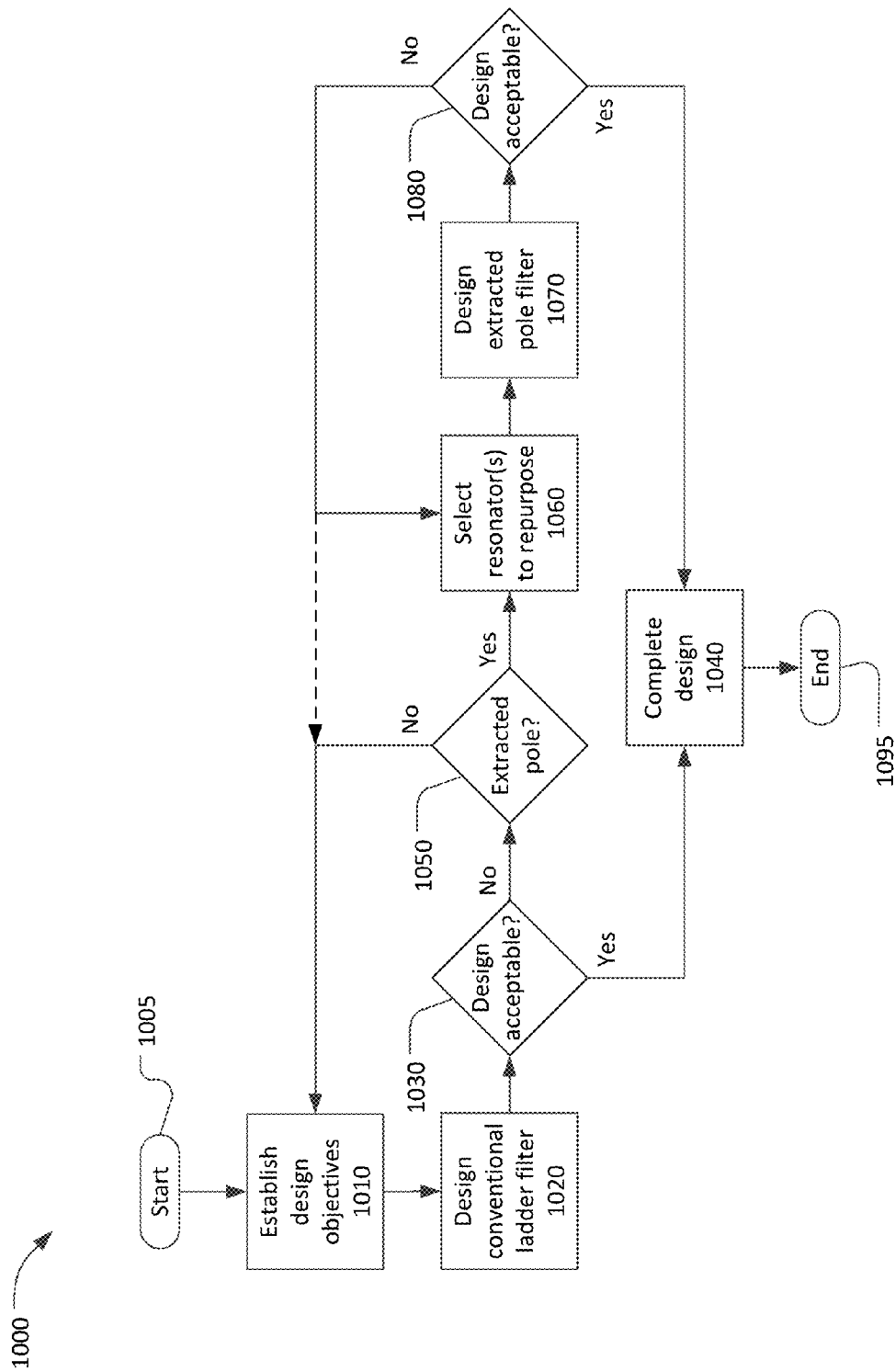
FIG. 10 is a flow chart of a method for designing a filter incorporating one or more extracted pole resonators.

FIG. 10 is a flow chart of a process 1000 for designing a filter that incorporates one or more extracted poles. The process 1000 starts at 1005 with a specification on the filter to be designed. The process 1000 ends at 1095 upon completion of a satisfactory filter design. The process 1000 may be, in many cases, cyclic, with various steps of the process repeated iteratively to arrive at a satisfactory design.

The specification at 1005 may define both required and desired characteristics of the filter. Typically, the specification on a bandpass filter will define a passband frequency range and one or more stopband frequency ranges. The specification may also define a maximum insertion loss over the passband frequency range, and/or a minimum insertion loss for each of the stopband frequency ranges. The specification may include other parameters such as a minimum return loss or maximum VSWR (voltage standing wave ratio) at the input and/or output of the filter over the passband frequency range when the filter is coupled to a particular impedance.

At 1010, a set of design objectives may be established based on the specification from 1005. Typically, the set of design objectives will includes all of the required characteristics from the specification as well as targets for any desired characteristics. The set of design objectives may also include cost-driven targets such as a maximum number of resonators, a particular type of piezoelectric substrate, particular manufacturing processes, and/or a maxim piezoelectric substrate area.

Figures 2A, 2B:
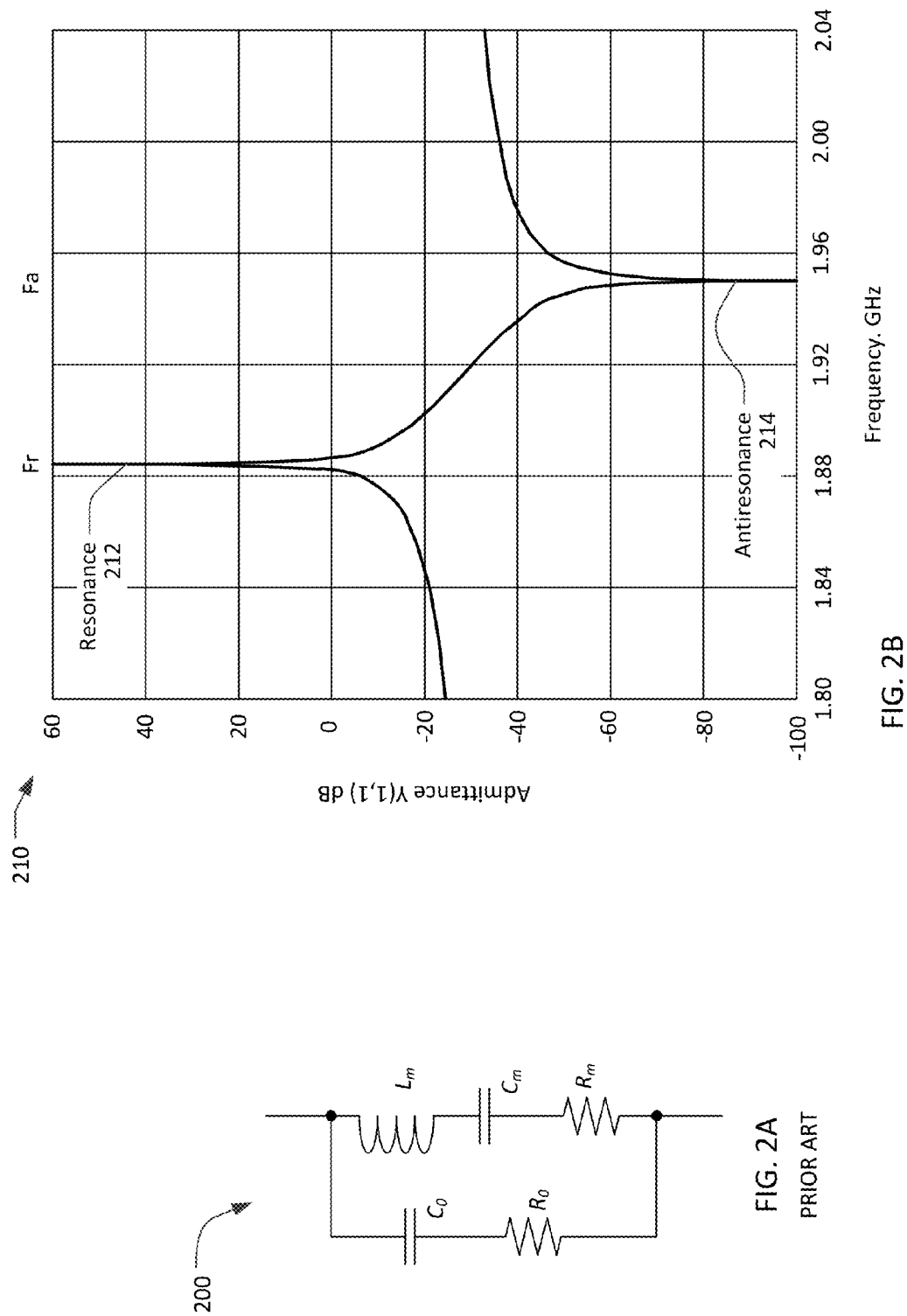
FIG. 2A is an equivalent circuit of a SAW resonator.
FIG. 2B is graph of the admittance of a lossless SAW resonator.

A 1020, a conventional ladder filter may be designed as an attempt to satisfy the design objectives from 1010. The ladder filter design at 1020 may be performed, for example, by a design engineer using a circuit design software tool and/or an electromagnetic (EM) analysis software tool. When a circuit design tool is used, the ladder filter may be analyzed as an electronic circuit, with the SAW resonators represented by combinations of lumped capacitor, inductor, and resistor elements. For example, each resonator may be represented by a BVD model as previously shown in FIG. 2A. When an EM analysis tool is used, the filter may be represented by models of the SAW resonator IDTs on a piezoelectric substrate. A preliminary design may be performed using a circuit analysis tool and then refined using an EM analysis tool. Either or both of circuit design tool and the EM analysis tool may be capable of automated optimization of the filter design to satisfy, to the extent possible, the design objectives.

Although real resonators have loss, an initial filter design at 1020 may be done assuming lossless resonators, with the loss effects added later in the design effort. Assuming lossless resonators simplifies the filter synthesis procedure and the characteristics of the transfer function can be described by the poles and zeros of the attenuation function. Alternatively, filter synthesis can include loss effects of the resonators devices, and the filter performance predicted with an understanding that the poles and zeros of the transfer function do not have an infinite or zero value respectively.

At 1030, a determination is made whether or not the filter design from 1020 is acceptable, which is to say whether or not the filter design from 1020 satisfies (or is acceptable close to satisfying) the design objectives from 1010. When the filter design is satisfactory ("yes" at 1030), the design may be completed at 1040. Completing the design at 1040 may include, for example, defining a package for the filter and necessary interconnections within the package. Completing the design may also include adjusting the filter design if necessary to compensate for the effects (e.g. interconnection inductances and stray capacitances) of the package and interconnects. Once the design is completed at 1040, the process ends at 1095.

When a determination is made at 1030 that the filter design from 1020 is not acceptable ("no" at 1030), a further decision is made at 1050 whether or not the filter design can be improved with an extracted pole, which is to say improved by repurposing one or more resonators within the design from 1020. In general terms, an extracted pole may be considered when the filter design from 1020 deviated from the design objectives in an asymmetrical manner, failing to satisfy the requirements at one side of the passband while comfortably satisfying the requirements on the other side of the passband. In particular, an extracted pole filter may be appropriate when one edge (particularly the upper edge) of the passband is not sufficiently sharp, and/or a stop band to either side of the passband is not sufficiently broad. In either situation, a resonator that generates a transmission zero either above or below the passband may be repurposed to generate a transmission zero on the other side of the passband.

When a determination is made at 1050 that an extracted pole is unlikely to improve the filter design from 1020 ("no" at 1050), the process may return to 1010. The set of design objective may be modified (for, example by allowing a larger piezoelectric wafer area to accommodate more resonators) and the process may be repeated until an acceptable filter design is established.

When a determination is made at 1050 that incorporating an extracted pole has the potential to improve the filter design from 1020 ("yes" at 1050), the process may proceed to 1060 where one or more resonators may be selected to repurpose. As previously described, a shunt resonator may be repurposed by changing its motional resonance from a frequency lower than the passband to a frequency above, and typically adjacent to, the upper edge of the passband. A series resonator may be repurposed by changing its anti-resonance from a frequency above the passband to a frequency lower than the pass band. In either case, a transmission zero is extracted from one side of the passband and moved to the other side of the passband when the resonator is repurposed. Experience has shown that a filter may be easier to realize if the repurposed resonator is at the end of the ladder structure and connected to either the input or the output of the filter.

The extracted pole filter, which is to say the filter with one or more repurposed resonators, is then designed at 1070. This design includes setting the resonant and/or anti-resonant frequencies of the repurposed resonators and adjusting the resonant/anti-resonant frequencies and other characteristics of the other resonators to compensate for the transmission zero that was moved from one side of the passband to the other. The design techniques and tools used at 1070 may be similar to or the same as the techniques and software tools used at 1020.

At 1080, a determination is made whether or not the extracted pole filter design from 1070 is acceptable, which is to say whether or not the filter design from 1070 satisfies (or is acceptably close to satisfying) the design objectives from 1010. When the filter design is satisfactory ("yes" at 1080), the design may be completed at 1040 as previously described. Once the design is completed at 1040, the process ends at 1095.

When a determination is made at 1080 that the filter design from 1070 is not acceptable ("no" at 1080), the process 100 may return to 1060 to select a different resonator or an additional resonator to repurpose. If the design from 1070 already included two repurposed resonators, the process may return to 1010 and the set of design objective may be modified (for, example by allowing a larger piezoelectric wafer area to accommodate more resonators). The process 1000 may then be repeated until an acceptable filter design is established.

Figure 11:
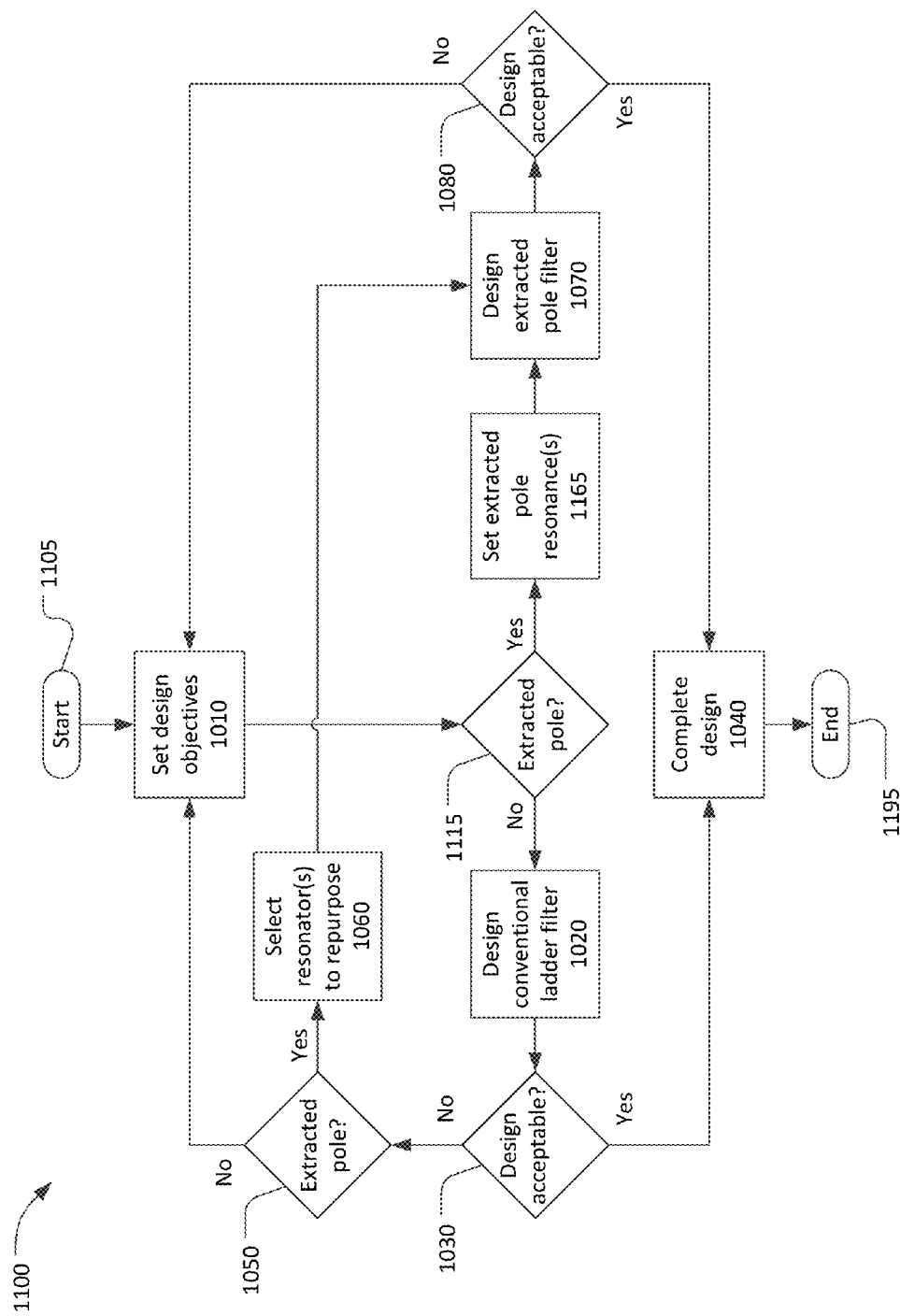
FIG. 11 is a flow chart of another method for designing a filter incorporating one or more extracted pole resonators.

FIG. 11 is a flow chart of another process 1100 for designing a band-pass filter. The process 1100 starts at 1105 with a specification on the filter to be designed as previously described. The process 1100 ends at 1195 upon completion of a satisfactory filter design. The process 1100 may be, in many cases, cyclic, with various steps of the process repeated iteratively to arrive at a satisfactory design. The actions 1010 to 1080 in the process 1100 are similar or identical to the corresponding actions in the process 1000. Complete descriptions of these actions will not be repeated.

After a set of design objectives are established at 1010, a determination is made at 1115 whether or not the filter design requires or would benefit from an extracted pole, which is to say a shunt resonator having a motional resonant frequency above, and typically adjacent to, the upper edge of a passband, or a series resonator with an anti-resonance frequency below the passband. While the term "extracted pole" is maintained for consistency, actual extract of a transmission zero from one side of the passband by repurposing a resonator may not occur in the process 1100. The determination may be made at 1115 by an engineer experienced in the design of band-pass filter using acoustic resonators after consideration of the design objectives. In particular, the engineer may determine that an extracted pole is appropriate when the design objectives require a very sharp transition at the upper edge of the passband and/or a stop band on the lower side of the passband is unusually broad.

When a determination is made at 1115 to proceed with the design of a filter without an extracted pole ("no" at 1115), the process may continue at 1020. The subsequent actions are identical to the process 1000 as previously described.

When a determination is made at 1115 to proceed with the design a filter incorporating an extracted pole ("yes" at 1115), a preliminary value for the frequency of the extracted transmission zero may be set at 1165. Since this value is set prior to the design of a filter network, actual extraction of this transmission zero from one side of the passband and relocation to the other side of the passband does not actually occur during the design process. When the design objectives from 1010 require a very sharp transition at the upper edge of the passband, the motional resonance of shunt resonator may be set to a frequency above, and typically adjacent to, the upper edge of the passband. When the objectives from 1010 require a wide stop band on the lower side of the passband, the anti-resonance of a series resonator may be set to a frequency below, and typically offset from, the lower edge of the passband.

The extracted pole filter is then designed at 1070. A filter network including the resonators defined at 1165 may be postulated, refined, and optimized using design techniques and tools similar to, or the same as, the techniques and software tools used at 1020, as previously described. The design at 1070 may include adjusting the motional resonance or anti-resonance frequency of the resonator defined at 1165.

At 1080, a determination is made whether or not the filter design from 1070 is acceptable, which is to say whether or not the filter design from 1070 satisfies (or is acceptably close to satisfying) the design objectives from 1010. When the filter design is satisfactory ("yes" at 1080), the design may be completed at 1040 as previously described. Once the design is completed at 1040, the process ends at 1095.

When a determination is made at 1080 that the filter design from 1070 is not acceptable ("no" at 1080), the process 1100 may return to 1010 and the set of design objective may be modified (for, example by allowing a larger piezoelectric wafer area to accommodate more resonators). The process 1100 may then be repeated until an acceptable filter design is established.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A bandpass filter, comprising:
   a plurality of series acoustic resonators connected in series between an input and an output; and
   a plurality of shunt acoustic resonators including a first shunt acoustic resonator, each shunt acoustic resonator connected between a ground and one of the input, the output, and a junction between two of the plurality of series acoustic resonators, wherein
   the first shunt acoustic resonator has a motional resonance frequency higher than an upper edge of a passband of the bandpass filter and lower than respective anti-resonance frequencies of all of the plurality of series acoustic resonators, and
   the first shunt acoustic resonator is not in parallel with any other shunt acoustic resonator.

2. The bandpass filter of claim 1, wherein the first shunt acoustic resonator is connected between the ground and one of the input and the output.

3. The bandpass filter of claim 1, wherein:
   a second shunt acoustic resonator from the plurality of shunt acoustic resonators has a motional resonance frequency greater than or equal to the motional resonance frequency of the first shunt acoustic resonator.

4. The bandpass filter of claim 3, wherein
   the first shunt acoustic resonator is connected between the ground and one of the input and the output, and
   the second shunt acoustic resonator is connected between the ground and the other of the input and the output.

5. The bandpass filter of claim 3, wherein the motional resonance frequency of the second shunt acoustic resonator is less than respective anti-resonance frequencies of all of the plurality of series acoustic resonators.

6. A method to design a bandpass filter including a plurality of series acoustic resonators connected in series between an input and an output and a plurality of shunt acoustic resonators, each shunt acoustic resonator connected between a ground and one of the input, the output, and a junction between two of the plurality of series acoustic resonators, the method comprising:
   designing a conventional ladder filter in which motional resonance frequencies of all of the plurality of shunt acoustic resonators are less than a lower edge of a passband of the bandpass filter and anti-resonance frequencies of all of the plurality of series acoustic resonators are greater than an upper edge of the pass band;
   identifying one of the plurality of shunt acoustic resonators as a first shunt resonator; and
   repurposing the first shunt resonator by setting its motional resonance frequency to a frequency higher than and adjacent to the upper edge of the passband,
   whereby a transmission zero generated by the first shunt resonator is moved from a frequency below the passband to a frequency above and adjacent to the upper edge of the passband.

7. The method of claim 6, wherein the first shunt resonator is connected between the ground and one of the input and the output.

8. The method of claim 6, wherein the motional resonance frequency of the first shunt resonator is set to a frequency less than respective anti-resonance frequencies of all of the plurality of series acoustic resonators.

9. The method of claim 6, further comprising:
   setting a motional resonance frequency of a second shunt resonator from the plurality of shunt acoustic resonators to a frequency equal to or greater than the motional resonance frequency of the first shunt resonator.

10. The method of claim 9, wherein
    the first shunt resonator is connected between the ground and one of the input and the output, and
    the second shunt resonator is connected between the ground and the other of the input and the output.

11. The method of claim 9, wherein the motional resonance frequency of the second shunt resonator is less than respective anti-resonance frequencies of all of the plurality of series acoustic resonators.

* * * * *